US010716242B2

(12) United States Patent
Kam et al.

(10) Patent No.: US 10,716,242 B2
(45) Date of Patent: Jul. 14, 2020

(54) DATA CENTER MODULAR SYSTEMS (71) Applicant: Google LLC, Mountain View, CA (US)

(72) Inventors: Pascal Kam, Union City, CA (US); Grace Wu, Santa Clara, CA (US); Saurin Purohit, Douglasville, GA (US); Kenneth Dale Shaul, Sunnyvale, CA (US); Siddharth Sheli, Fremont, CA (US); Thomas R. Kowalski, Santa Cruz, CA (US); Bruce Baxter, Hollister, CA (US); Jim O'Connor, Half Moon Bay, CA (US); Brandon Gries, Monona, WI (US); Gerard V. Gioia, West Chester, PA (US); Steven K. Bowman, Hillsborough, NC (US)

(73) Assignee: Google LLC, Mountain View, CA (US)

( * ) Notice: Subject to any disclaimer, the term of this patent is extended or adjusted under 35 U.S.C. 154(b) by 386 days.

(21) Appl. No.: 15/653,973

(22) Filed: Jul. 19, 2017

(65) Prior Publication Data
US 2018/0027701 A1  Jan. 25, 2018

Related U.S. Application Data (60) Provisional application No. 62/364,161, filed on Jul. 19, 2016.

(51) Int. Cl.
H05K 7/20 (2006.01)
G06F 1/20 (2006.01)
(Continued)

(52) U.S. Cl.
CPC .......... *H05K 7/20745* (2013.01); *G06F 1/20* (2013.01); *H05K 7/1485* (2013.01); *H01R 43/26* (2013.01)

(58) Field of Classification Search
CPC .. H05K 7/1485; H05K 7/20745; H01R 43/26; G06F 1/20
See application file for complete search history.

(56) References Cited

U.S. PATENT DOCUMENTS 7,430,118 B1  9/2008 Noteboom et al.
7,738,251 B2  6/2010 Clidaras et al.
(Continued)

FOREIGN PATENT DOCUMENTS

CN  202083990 A1  12/2011
CN  102461358  5/2012
(Continued)

OTHER PUBLICATIONS

Extended European Search Report issued in European Application No. 17182176.2, dated Jan. 5, 2018, 8 pages.
(Continued)

Primary Examiner — Steven S Anderson, II
(74) Attorney, Agent, or Firm — Fish & Richardson P.C.

(57) ABSTRACT

A modular data center system includes an upper module including a roller assembly attached to a frame of the upper module, the roller assembly configured to engage at least a portion of a rail assembly attached to a structure of a data center building; and a lower module attachable to the upper module and configured to suspend above a floor of a human-occupiable workspace of the data center that supports a plurality of racks including a plurality of heat-generating electronic devices, the lower module including a power support assembly configured to provide electrical power to the plurality of heat-generating electronic devices.

23 Claims, 8 Drawing Sheets (51) Int. Cl.
*H05K 7/14* (2006.01)
*H01R 43/26* (2006.01)

(56) References Cited

U.S. PATENT DOCUMENTS

| | | |
|---|---|---|
| 8,031,468 B2 | 10/2011 | Bean et al. |
| 9,313,929 B1 * | 4/2016 | Malone ............ H05K 7/20745 |
| 2009/0241578 A1 | 10/2009 | Carlson et al. |
| 2010/0315775 A1 * | 12/2010 | Grantham .......... H05K 7/20745 361/688 |
| 2012/0155027 A1 | 6/2012 | Broome et al. |
| 2013/0032310 A1 | 2/2013 | Jaena et al. |
| 2015/0145391 A1 | 5/2015 | Broome et al. |
| 2015/0342094 A1 | 11/2015 | Ross et al. |
| 2016/0138260 A1 | 5/2016 | Matoric et al. |

FOREIGN PATENT DOCUMENTS

| | | |
|---|---|---|
| WO | WO 2010/144224 | 12/2010 |
| WO | WO 2012/109209 | 8/2012 |

OTHER PUBLICATIONS

Office Action issued in Taiwanese Application No. 106124180, dated May 15, 2018, 26 pages (with English Translation).
David Chernicoff, ZDNet, Modular data centers new target for Aecom and Project Frog [online], Nov. 23, 2015, retrieved from <http://www.zdnet.com/article/modular-data-centers-new-target-for-aecom-and-project-frog/>, 2 pages.
Marco Magarelli, Open Compute Project, Faster, Leaner, Smarter, Better Data Centers [online], Mar. 7, 2014, retrieved from <http://www.opencompute.org/blog/faster-leaner-smarter-better-data-centers/>, 8 pages.
EP Office Action in European Application No. 17182176, dated Apr. 9, 2020, 2 pages.

* cited by examiner

DATA CENTER MODULAR SYSTEMS

CROSS-REFERENCE TO RELATED APPLICATION

This application claims priority to U.S. Provisional Patent Application Ser. No. 62/364,161, filed Jul. 19, 2016, and entitled "Cooling a Data Center," the entire contents of which are incorporated by reference herein.

TECHNICAL FIELD

The present disclosure relates to systems and methods for cooling data center systems and computing components.

BACKGROUND

Data centers house various computing systems and components such as computer processors, storage systems or drives, servers, and other computing components. A data center may take up a room in a building, an entire building itself and may be stationary in form or may be portable, for example housed in a shipping container. A data center, whether stationary or portable, may also be modular. The computer related components housed in a data center consume significant amounts of electrical power and thereby produce significant amounts of heat during computing and storage operations. If the computer related components exceed certain temperatures, the performance of the components can be compromised and/or the components may fail. Accordingly, cooling systems are generally implemented to maintain proper and efficient functioning of the computer related components housed in a data center as the components operate to transfer, process, and store data. The cooling systems may include components configured to move fluids such as air or liquid through various configurations and based on varying conditions.

SUMMARY

In a general implementation, a modular data center system includes an upper module including a roller assembly attached to a frame of the upper module, the roller assembly configured to engage at least a portion of a rail assembly attached to a structure of a data center building; and a lower module attachable to the upper module and configured to suspend above a floor of a human-occupiable workspace of the data center that supports a plurality of racks including a plurality of heat-generating electronic devices, the lower module including a power support assembly configured to provide electrical power to the plurality of heat-generating electronic devices.

In an aspect combinable with the general implementation, the upper module further includes an air conditioning module.

In another aspect combinable with any of the previous aspects, the lower module includes at least one side that extends vertically from a ceiling that is attached to the frame of the upper module, the ceiling including an aperture to permit airflow from the air conditioning module to a volume defined by the side and the ceiling.

In another aspect combinable with any of the previous aspects, the volume includes a portion of a conditioned air plenum that extends from the ceiling of the lower module to a top of the plurality of racks, the conditioned air plenum further defined between back sides of rows of the plurality of racks.

In another aspect combinable with any of the previous aspects, the air conditioning module includes a conditioning module positioned over the aperture in the ceiling of the lower module; and a fan positioned to circulate a conditioned airflow from the conditioning module, through the portion of the conditioned air plenum, through the back sides of the rows of the plurality of racks, through front sides of the rows of the plurality of racks to the human-occupiable workspace, and to the conditioning module.

In another aspect combinable with any of the previous aspects, the conditioning module includes at least one of a cooling coil, a heating coil, an energy recovery ventilator, or a constant or variable air volume box.

In another aspect combinable with any of the previous aspects, the lower module further includes a seal to receive a portion of the plurality of racks and seal against an airflow between the human-occupiable workspace and the portion of conditioned air plenum.

In another aspect combinable with any of the previous aspects, the roller assembly includes a plurality of wheels or sliders that engage the rail assembly.

In another aspect combinable with any of the previous aspects, the structure of the data center building includes a column that extends between the floor and a roof of the data center building.

Another aspect combinable with any of the previous aspects further includes an accessory module coupled to the upper module.

In another aspect combinable with any of the previous aspects, the accessory module includes a pipe rack.

In another general implementation, a data center system includes an upper module including an air conditioning module; a lower module attached to the upper module and configured to suspend above a floor of a human-occupiable workspace of a data center building that supports a plurality of racks including a plurality of heat-generating electronic devices, the lower module including a power support assembly configured to provide electrical power to the plurality of heat-generating electronic devices; a roller or slider assembly attached to a frame of the upper module, the roller assembly including at least one roller or slider; and a rail assembly attachable to a structure of the data center building, the rail assembly including a beam engageable by the roller or slider.

In an aspect combinable with the general implementation, the lower module includes at least one side that extends vertically from a ceiling that is attached to the frame of the upper module, the ceiling including an aperture to permit airflow between the upper module and a volume defined by the side and the ceiling of the lower module.

In another aspect combinable with any of the previous aspects, the volume includes a portion of a conditioned air plenum that extends from the ceiling of the lower module to a top of the plurality of racks, the conditioned air plenum further defined between back sides of rows of the plurality of racks.

In another aspect combinable with any of the previous aspects, the air conditioning module is positioned over the aperture in the ceiling of the lower module and includes a conditioning module and a fan, the fan positioned over the aperture to circulate a conditioned airflow from the conditioning module, through the portion of the conditioned air plenum, through the back sides of the rows of the plurality of racks, through front sides of the rows of the plurality of racks to the human-occupiable workspace, and back to the conditioning module.

In another aspect combinable with any of the previous aspects, the conditioning module includes at least one of a cooling coil, a heating coil, an energy recovery ventilator, or a constant or variable air volume box.

In another aspect combinable with any of the previous aspects, the lower module further includes a seal to receive a portion of the plurality of racks and seal against an airflow between the human-occupiable workspace and the portion of the conditioned air plenum.

In another aspect combinable with any of the previous aspects, the structure of the data center building includes a column that extends between the floor and a roof of the data center building.

In another aspect combinable with any of the previous aspects, the beam extends between at least two columns of the data center building.

Another aspect combinable with any of the previous aspects further includes an accessory module coupled to the upper module.

In another aspect combinable with any of the previous aspects, the accessory module includes a pipe rack.

In another aspect combinable with any of the previous aspects, the accessory module further includes a plurality of fire protection electrical assemblies that include wiring and electrical connectors for a fire protection system.

In another aspect combinable with any of the previous aspects, the accessory module further includes at least a portion of a fire protection system piping system that includes a plurality of sprinkler heads of the fire protection system.

In another aspect combinable with any of the previous aspects, the accessory module further includes a plurality of data center lighting fixtures or data center lighting wiring assemblies.

Another aspect combinable with any of the previous aspects further includes a support structure that includes at least a portion of the ceiling to thermally separate cold air aisle of the conditioned plenum from a warm air aisle.

In another general implementation, a method of conditioning a data center includes installing a first module of a data center cooling system on a rail assembly attached to a data center building, the first module including a frame and an air conditioning module; attaching a second module of the data center cooling system to the first module, the second module including a panel attached to the frame of the first module and sides that extend from the panel to suspend over a floor of the data center building; and moving the first and second modules of the data center cooling system adjacent to at least one row of a plurality of data center racks that support a plurality of heat-generating electronic devices by moving the first module on the rail system through a human-occupiable aisle of a workspace of the data center building defined between rows of columns of the data center building.

An aspect combinable with the general implementation further includes circulating a cooling fluid through a supply conduit, to the cooling module, that is supported by a third module of the data center cooling system attached to the first module.

Another aspect combinable with any of the previous aspects further includes circulating, with a fan of the cooling module, an airflow from a cooling coil of the cooling module through an opening in the panel and into a cold air plenum defined by the panel and the sides of the second module.

Another aspect combinable with any of the previous aspects further includes circulating the airflow through the plurality of data center racks; receiving, into the airflow, heat from the plurality of heat-generating electronic devices; and circulating the heated airflow through the workspace of the data center building and to the cooling coil.

In another aspect combinable with any of the previous aspects, the data center cooling system includes a first data center cooling system.

Another aspect combinable with any of the previous aspects further includes installing at least another row of a plurality of data center racks that support a plurality of heat-generating electronic devices into the data center building; based on the installation of the at least installing a first module of a second data center cooling system on the rail assembly attached to the data center building, the first module of the second data center cooling system including a frame and a cooling module; attaching a second module of the second data center cooling system to the first module of the second data center cooling system, the second module of the second data center cooling system including a panel attached to the frame of the first module of the second data center cooling system and sides that extend from the panel to suspend over the floor of the data center building; and moving the first and second modules of the second data center cooling system adjacent to the another row of the plurality of data center racks by moving the first module of the second data center cooling system on the rail system through the human-occupiable aisle of the workspace of the data center building defined between rows of columns of the data center building.

Another aspect combinable with any of the previous aspects further includes fluidly connecting the cooling modules of the first modules of the first and second data center cooling systems to a source of cooling fluid.

Another aspect combinable with any of the previous aspects further includes electrically coupling the plurality of heat-generating electronic devices to a main power supply through electrical conduits supported on the second module.

In another aspect combinable with any of the previous aspects, the data center cooling system includes a first data center cooling system.

Another aspect combinable with any of the previous aspects further includes adjusting a power density of at least a portion of the plurality of heat-generating electronic devices; based on the adjustment of the power density: installing a first module of a second data center cooling system on the rail assembly attached to the data center building, the first module of the second data center cooling system including a frame and a cooling module; attaching a second module of the second data center cooling system to the first module of the second data center cooling system, the second module of the second data center cooling system including a panel attached to the frame of the first module of the second data center cooling system and sides that extend from the panel to suspend over the floor of the data center building; and moving the first and second modules of the second data center cooling system adjacent to the row of the plurality of data center racks by moving the first module of the second data center cooling system on the rail system through the human-occupiable aisle of the workspace of the data center building defined between rows of columns of the data center building; and operating the first and second data center cooling systems to cool the plurality of heat-generating electronic devices.

Implementations according to the present disclosure may include one or more of the following features. For example, implementations of a data center system according to the present disclosure may be modular and scalable to account for different sized (e.g., total power) data centers. For example, the data center cooling system can be scalable between, e.g., 500 kW data centers (e.g., IT power) and 500 MW data centers. As another example, the scalable data center cooling system can be included of modular, factory-assembled components to reduce a construction schedule of the data center. Further, the data center cooling system may have significant deployment efficiency, allowing for changeable quantities and dimensions of, e.g., rows of electronic device racks, changeable power densities, and otherwise. As yet a further example, the data center cooling system may have significant power and cooling efficiency, such that units of IT power (e.g., racks of servers) may be installed to share cooling and allow for over-subscription of power infrastructure (e.g., maximum power available less than maximum rated IT power).

As yet another example, the data center system may allow for more efficient costs of small-scale data centers by utilizing similar modules that are used to build large data centers, by taking advantage of the economies of scale and reduction in costly, specialized equipment designed for small-scale data centers. As another example, modularization of an entire server floor to include all aspects of required interfaces and products may minimize construction, costs, time and improve quality, thereby gaining repeatability and consistency from any project site. Further, modules of the data center may be built off-site from the data center building, itself, allowing for parallel construction schedules to save deployment time. As another example, existing data centers may be retrofitted (e.g., with a rail or other support assembly) to allow the modularization of existing, conventionally-deployed data centers. As yet another example, construction of data centers may be made safer compared to convention techniques when fabrication of part or all of some key data center systems (e.g., the cooling system) is performed offsite. Further, fabrication of such data center cooling systems may be performed at a location which has necessary skilled labor, even if such a location is different than a data center location. Thus, there may be a reduced dependency on local (e.g., local to the data center location) labor availability, thereby reducing construction risks and producing construction timelines with more predictable schedules. Other advantages of moving construction offsite are: because the offsite-fabricated systems can be completed in a controlled, weather-protected environment by groups of the same workers, it is possible to improve system quality and consistency and optimize fabrication techniques. The schedule can also be reduced by moving key systems off the critical path. As yet another example, the data center modular system may provide for effectively limitless bidirectional scalability, aided by the symmetry of the interfaces of the system, e.g., with the vertical attachment points on each of the faces of a lower module of the system.

The details of one or more implementations of the subject matter described in this disclosure are set forth in the accompanying drawings and the description below. Other features, aspects, and advantages of the subject matter will become apparent from the description, the drawings, and the claims.

DETAILED DESCRIPTION

Figure 1A:
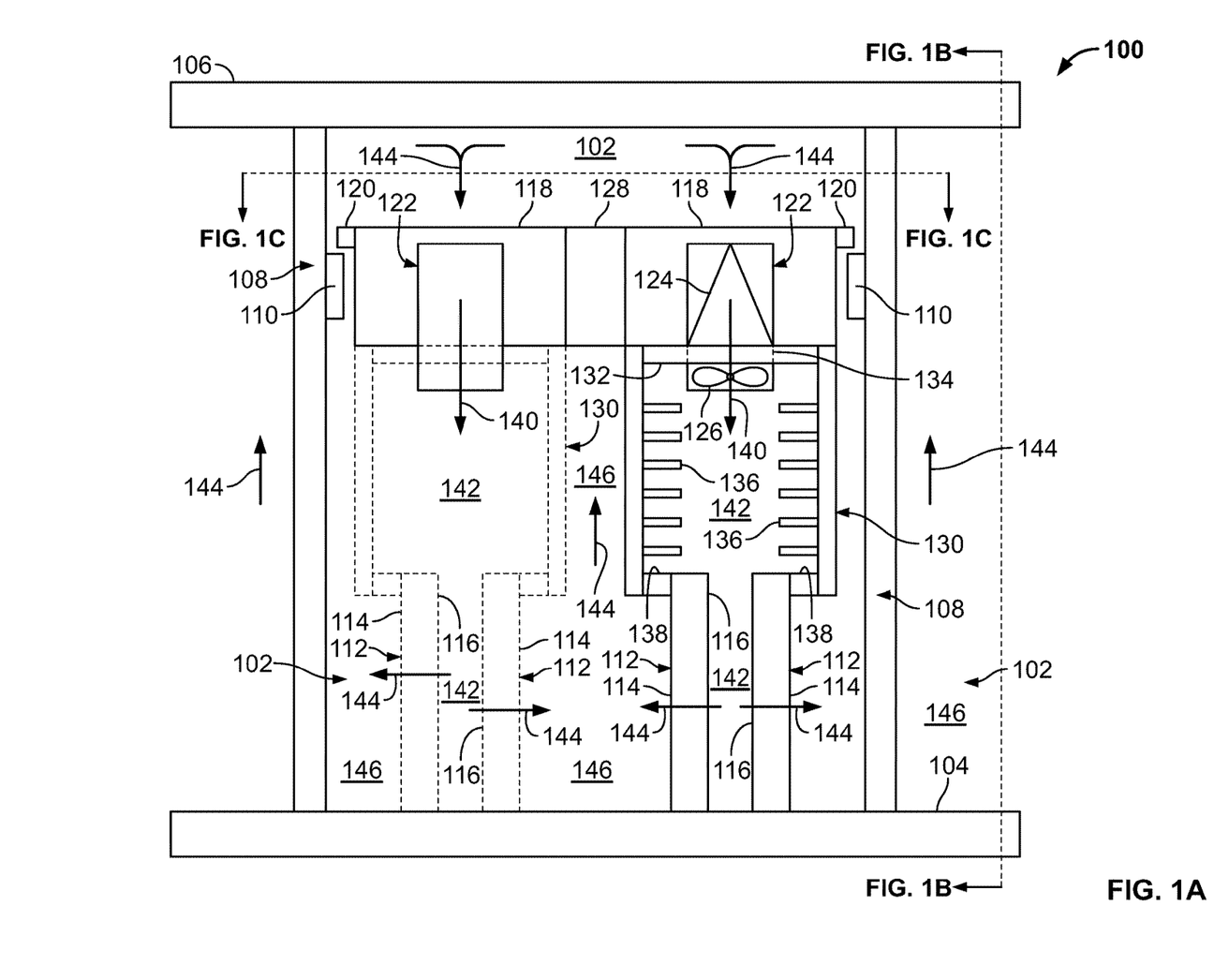
FIGS. 1A-1C are end, side, and top views, respectively, of a schematic illustration of a scalable data center cooling system according to the present disclosure.
Figure 1B:
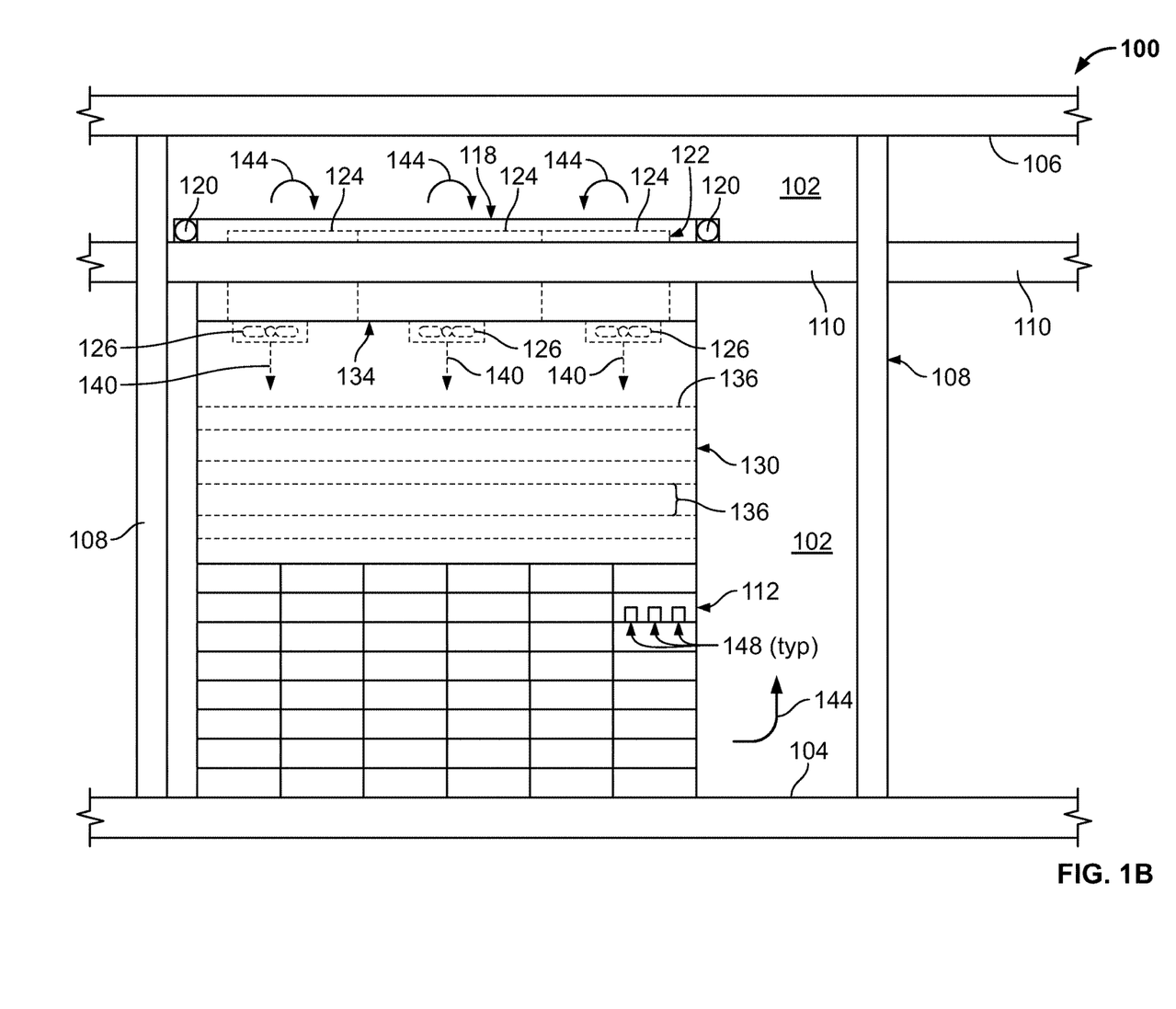
Figure 1C:
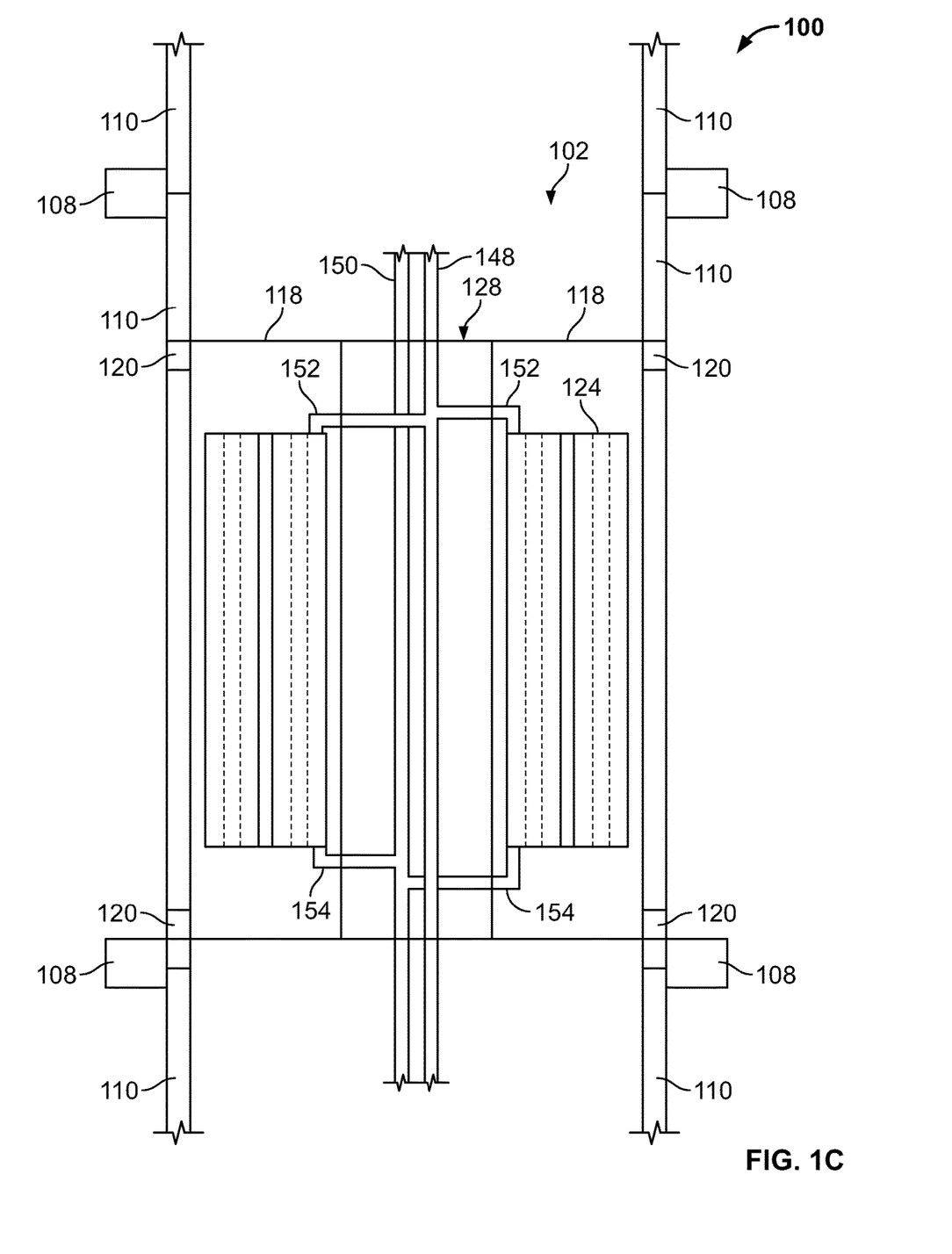

FIGS. 1A-1C are end, side, and top views, respectively, of a schematic illustration of a scalable data center cooling system 100. Generally, the data center cooling system 100 includes one or more-lower modules 130 and one or more upper modules 118 that operate to cool heat-generating electronic devices (e.g., servers, processors, network devices, or other electronic devices) supported in rows of racks 112. In this example, heat-generating devices 148 are shown in a tray on the rack 112 in FIG. 1B. The racks 112 may support multiple trays, which may be mounted vertically or horizontally, and may include one or more motherboards or daughterboards to support the heat-generating devices 148.

The heat-generating electronic 148 devices in the racks 112 may be implemented for processing, transmitting and/or storing data. The heat-generating electronic devices 148 may include other computing devices or components related to the operation of the servers. The heat-generating computing devices 148 generate heat as the devices operate to process, transmit, and store data locally and with remote computing systems. In the case of servers, for example, the devices 148 may, for example be connected to a local or remote network and may receive and respond to various requests from the network to retrieve, process, and/or store data. The servers may facilitate communication over the Internet or an intranet to permit interaction with a plurality of remote computers and to provide requested services via applications running on the remote computers or on the servers. Accordingly, the data center cooling system 100 may include or be electrically coupled to one or more power sources for powering the servers and related components and include a communication interface which may be configured for wired and wireless transmissions to and from the data center. The power source may be connected to a power grid or may be generated by batteries or an on-site generator.

The upper modules 118 and the lower modules 130, as well as the racks 112, may be positioned in a human-occupiable workspace 102 of a data center building structure defined by a floor 104, a ceiling 106, and one or more support members 108 (e.g., columns or beams). For example, although in the implementation of system 100, the support members 108 are illustrated as columns (e.g., support members that extend between the floor 104 and the ceiling 106), in some alternative implementations, the support members 108 may include one or more beams (e.g., support members that extend parallel or substantially parallel to one or both of the floor 104 and the ceiling 106).

The floor 104 is suitable to support the racks 112, as well as other data center equipment not shown in this example (e.g., moving apparatus like forklifts, hand-trucks, as well as furniture, power equipment, and other components). In some example implementations, the floor 104 may be a finished floor, such as a concrete or cement floor, with or without additional covering (e.g., tile, laminate, or other covering). In alternative example implementations, the floor 104 may represent a raised floor (e.g., with individual floor tiles supported by posts or other structure) that is supported by a finished floor.

The ceiling 106, as shown, may be a finished ceiling of the data center building, such as a concrete or cement ceiling. In some aspects, the ceiling 106 may be an underside of a floor 104 that is above the human-occupiable workspace, such as in the case of a data center building with multiple levels. In alternative aspects, the ceiling 106 may represent a drop ceiling, with multiple, independent ceiling tiles supported in a grid structure.

As illustrated, the system 100 includes one or more rail assemblies 110 that are attached to the support members 108. For example, as shown in FIGS. 1B-1C, the rail assemblies 110 may extend between, and be attached to, adjacent support members 108 (e.g., columns) in the data center building structure. Alternatively, the rail assemblies 110 may extend between and across more than two support members 108, or may be attached to other structure of the data center building, such as, for example, the ceiling 106. In some implementations, the rail assemblies 110 may be part of the data center building structure, e.g., as weight-bearing structure of the building. For example, the rail assemblies 110 may be I-beams, C-channels, or other structural members that, e.g., prevent or help prevent buckling or movement of the support members 108. In alternative examples, the rail assemblies 110 may not be bear any weight of the data center building structure.

As illustrated, the one or more upper modules 118 are mounted on the rail assemblies 110 via one or more roller assemblies 120. In some aspects, each roller assembly 120 may be attached to a frame or housing of the upper module 118 and include one or more wheels, rollers, casters, or other reduced-friction surface that contactingly engages the rail assembly 110. The roller assemblies 120 facilitate movement of the upper modules 118 (and other components of the system 100) through the human-occupiable workspace 102 on the rail assemblies 110. As shown in FIG. 1B, there may be two roller assemblies 120 attached to the frames of each upper module 118, on sides of the frames adjacent to the rail assemblies 110. In alternative aspects, there may be more than two roller assemblies 120 attached to each upper module 118 to facilitate movement of the upper module 119 through the data center.

As illustrated, each upper module 118 include an air conditioning module 122 positioned within a frame of the upper module 118. The air conditioning module 122, in this example, includes an air-to-liquid heat exchanger 124, such as a cooling coil (e.g., water coil, glycol coil, DX coil, or other form of cooling coil) or heating coil (e.g., liquid or electric). The air conditioning module 122 may also include other conditioning devices, such as humidifiers, dehumidifiers, energy recovery ventilators, filters, and otherwise.

In this example, a cooling coil 124 is an A-frame cooling coil, although flat or other cooling coil forms are also suitable. In alternative aspects, the heat exchanger 124 may be a thermoelectric heat exchanger, such as, for example, a Peltier cooler. In any event, the heat exchanger 124 may be operated to receive a heated airflow from the racks 112 and cool the heated airflow to produce a cooling airflow to circulate to the racks 112. In some aspects, each air conditioning module 122 includes multiple cooling coils 124, e.g., to provide redundancy or prevent a lack of cooling if one of the cooling coils 124 is unusable. In alternative aspects, there may be one cooling coil 124 per air conditioning module 122.

The illustrated air conditioning module 122 also includes one or more fans 126. In the illustrated example, the fans 126 are positioned on a bottom side of the upper modules 118 and may also extend adjacent to or through apertures 135 on the bottom side of the upper modules 118. The illustrated fans 126 may be centrifugal or axial flow fans and controllable to circulate a cooling airflow (and a heated airflow) through the human-occupiable workspace 102. In some aspects, each air conditioning module 122 includes multiple fans 126, e.g., to provide redundancy or prevent a lack of cooling if one of the fans 126 is unusable.

Although the illustrated implementation of the air conditioning module 122 includes a cooling coil 124 and a fan 126, alternative implementations of the air conditioning module 122 may include additional or alternative components. For example, the air conditioning module 122 may include heaters (e.g., heating coils, electric heat, furnaces), humidifiers or evaporative cooling devices, boilers, dehumidifiers, energy recovery devices, variable air volume (VAV) boxes, air flow control and regulating stations, and other components.

The data center cooling system 100 also includes one or more lower modules 130. As shown in FIGS. 1A-1B, the lower modules 130 are mounted to the bottom sides of respective upper modules 118. In some examples, there may be a 1:1 ratio of lower modules 130 to upper modules 118. In other examples, there may be more-lower modules 130 than upper modules 118 (e.g., more than one lower module 130 is mounted to each upper module 118). In other examples, there may be fewer lower modules 130 than upper modules 118 (e.g., one lower module 130 is mounted to more than one upper module 118). The lower modules 130 may be permanently or semi-permanently mounted to the upper modules 118. For example, the lower modules 130 may be fastened, such as with screws, bolts, rivets, adhesive, or other fastening mechanisms, to the upper modules 118. Alternatively, the lower modules 130 may be welded or brazed to the upper modules 118.

Each lower module 130 includes sides that extend vertically downward from the upper module 118 to meet a top end of two rows of racks 112. For example, as shown in FIG. 1A, the lower module 130 includes a top side (e.g., with the aperture 134 there through) attached or adjacent to the bottom side of the upper module 118 and sides that extend to meet the tops of two rows of racks 112 with seals 138. The seals 138 (e.g., sheet metal, flexible vinyl, or other sealing material) couple bottom edges of the sides of the lower module 130 to top edges of the rows of racks 112. The seals 138 may prevent or substantially prevent (e.g., with little air leakage) air that is circulated from the upper module 118 to a cool air plenum 142 to escape into a warm air plenum of the human-occupiable workspace 102 of the data center building without passing through the racks 112.

As further illustrated, the lower modules 130 include one or more cable trays 136. The cable trays 136, for example, may support power cabling for the heat-generating devices 148, the fans 126, or other electricity-using components of the system 100. In addition or alternatively, other power supply support equipment, such as bus ducts, cord reels, lighting, and other equipment may be mounted to the lower modules 130 (e.g., in the cable trays 136 or to the sides of the module 130). As additional examples, the lower modules 130 may support control wiring, as well as fiber cabling and a fiber conveyance system.

In the illustrated implementation of the data center cooling system 100, an accessory module 128 is positioned between, and in some aspects, attached to, upper modules 118 that are side-by-side. In the illustrated implementation, the accessory module 128 includes or comprises a piping bridge that may support one or more pipes or other conduits. For example, as shown, a supply cooling liquid conduit 148 may be supported by the accessory module 128 and fluidly connect the cooling coils 124 (of the adjacent upper modules 118 or other upper modules) to a source of a cooling liquid (e.g., a chiller plant, evaporative cooling system, body of water, a combination thereof, or other source of cooling liquid). A return cooling liquid conduit 150 may also be supported by the accessory module 128 and fluidly connect the cooling coils 124 (of the adjacent upper modules 118 or other upper modules) to the source of cooling liquid.

In additional implementations, the accessory module 128 may support additional structure or data center operational equipment. For example, in some aspects, the accessory module 128 may include or be attached with a drop-down ceiling structure on a bottom side of the module 128 that helps thermally separate the warm air plenum 146 and the cold air plenum 142. In addition, the accessory module 128 may support or contain fire protection system equipment, such as piping, electrical conduit (e.g., a bus duct), sprinkler heads, and other equipment that is used in a fire protection system for the data center. As another example, the accessory module 128 may support or contain lighting equipment, such as electrical conduit and raceways or bus ducts, lights, and other equipment that is used in a lighting system for the data center.

In an example operation of the air conditioning module 122, a heated airflow 144 may pass into a warm air plenum 146 of the human-occupiable workspace 102 after passing through the racks 112. The heated airflow 144 is circulated (e.g., by the fans 126) through the warm air plenum 146 which extends upward toward the upper modules 118. The heated airflow 146 passes through the cooling coils 124, where it is cooled to remove heat generated by the electronic devices 148 (e.g., and other heat-generating objects in the human-occupiable workspace 102, such as workers or auxiliary equipment). A cooling airflow 140 is circulated (e.g., by the fans 126) from the cooling coils 124 into a cold air plenum 142 that is defined within the lower module 130 and between rows of racks 112, as shown. The cooling airflow 140 enters the back sides 116 of the racks 112, which are open (e.g., without cabinet or other structure to substantially impede airflow there through) to both the cold air plenum 142 and warm air plenum 146. As the cooling airflow 142 passes between back sides 116 of the racks 112 and front sides 114 of the racks 112, heat from the electronic devices 148 is convectively transferred into the airflow so that the heated airflow 144 exits the front sides 114.

As shown in FIGS. 1A-1C, both sets of modules (e.g., the upper modules 118 and lower modules 130), as well as the accessory module 128, are suspended above the floor 104. Thus, any sagging of the floor 104, or a floor above the floor 104 (e.g., in the case of a multi-story data center) due to, for instance, changes in loading on the floor(s) does not affect the modules' elevation (e.g., vertical position). For example, the upper modules 118 are supported by the rails 110, which in turn are supported by the building columns 108, and not, e.g., girders (upper floor support steel). This may be advantageous in that the interface between a lower module 130 and the racks 112 is not affected by upper floor loading.

Figure 2:
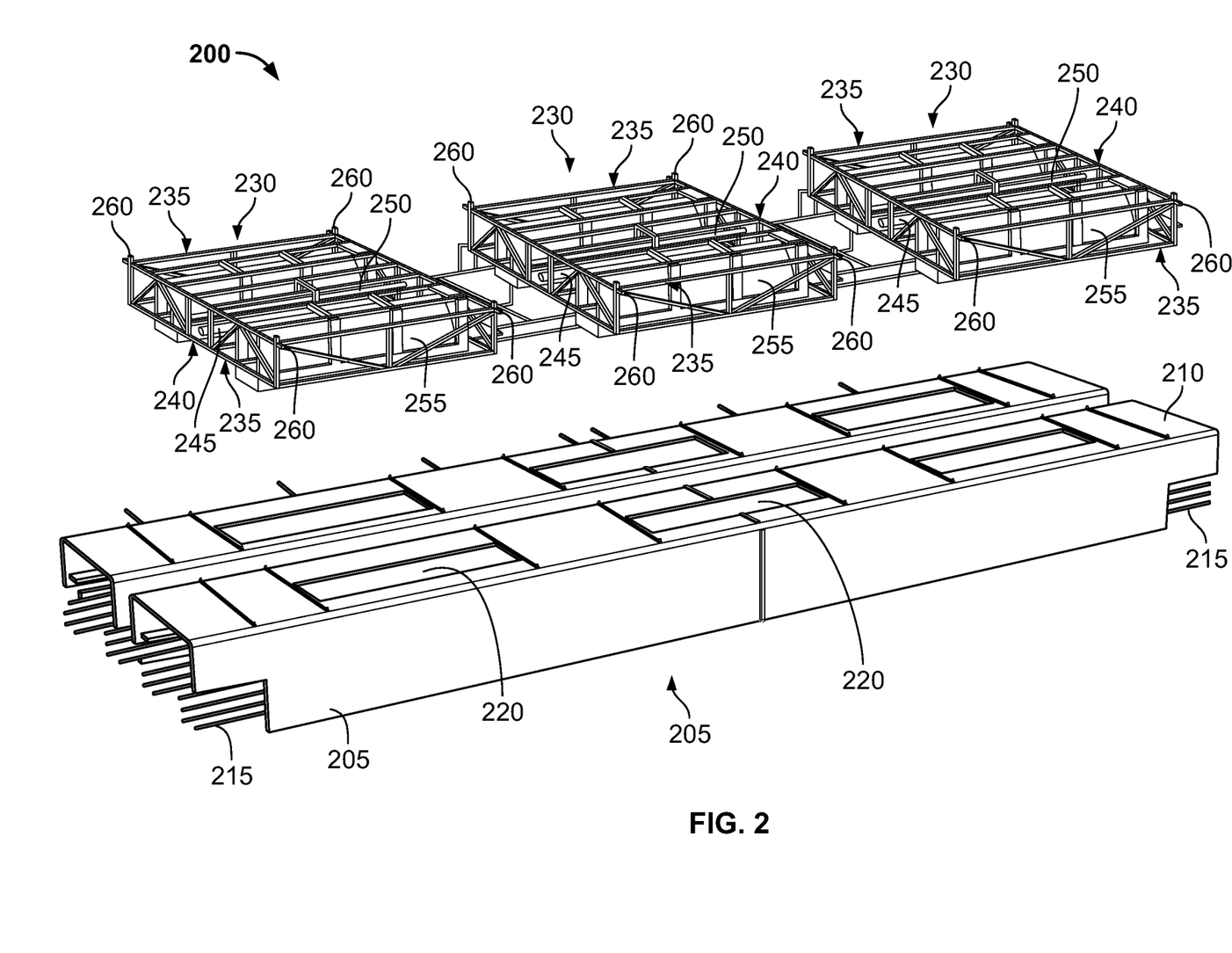
FIG. 2 is an isometric view of a schematic illustration of a data center system comprised of multiple scalable data center cooling systems according to the present disclosure.

FIG. 2 is an isometric view of a schematic illustration of a data center system 200 comprised of multiple scalable data center cooling systems. As shown in this figure, lower data center cooling modules 205 are shown, side-by-side. Each lower data center cooling module 205, for example, may be comprised of multiple lower modules 130 that are joined end-to-end as an integrated module 205. Each lower data center cooling module 205 is comprised of a top panel 210 that includes one or more apertures 220, and side panels 225 that extend downward from the top panel 210 on each of two lengthwise edges of the top panel 210. Mounted within a volume defined by the side panels 225 and top panel 210 are cable trays 215 that can support power and information equipment, such as power cabling, network cabling, cable reels, uninterruptible power supplies (UPS), and other equipment.

As shown in FIG. 2, the data center system 200 includes multiple upper data center cooling modules 230. Each upper data center cooling module 230 is attachable (e.g., permanently or semi-permanently) to the lower data center cooling module 205. Each upper data center cooling module 230, in this example, includes two upper modules 230 joined together by an accessory module 240 there between. Each upper module 230 includes a frame that supports a cooling coil 255. In some aspects, when the upper data center cooling modules 230 are attached to the lower data center cooling module 205, the cooling coils 255 are positioned vertically above the apertures 220. The cooling coils 255 may be fluidly connected to a cooling fluid supply conduit 250 and a cooling fluid return conduit 245 that are supported by the accessory module 240.

As illustrated in FIG. 2, roller assemblies 260 are mounted at corners of the upper modules 235. The roller assemblies 260 may facilitate movement of the upper data center cooling modules 230 along a rail system (e.g., I-beam, C-channel, or other structural members) that are part of or attached to a data center building structure.

Figure 3A:
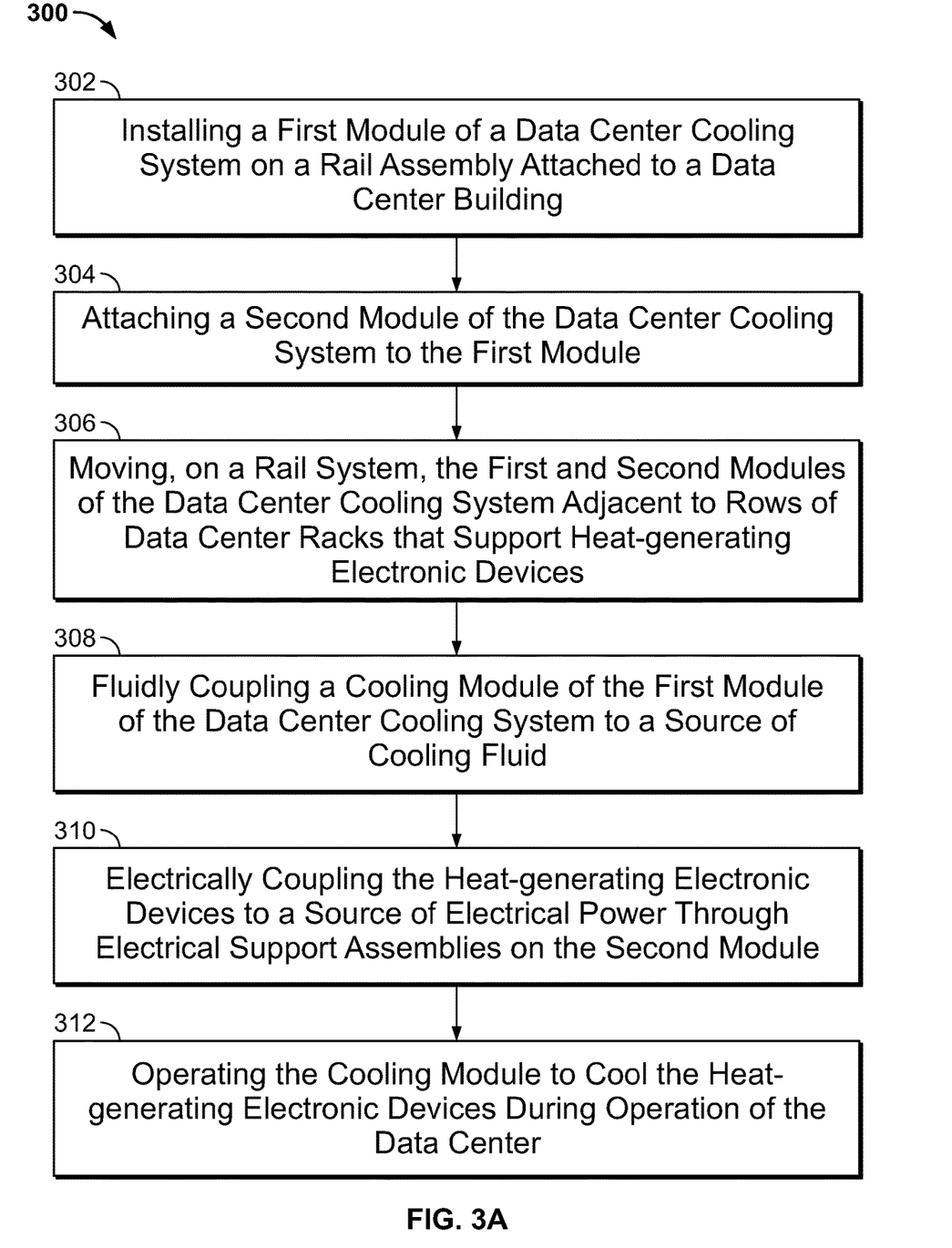
FIGS. 3A-3C are flowcharts depicting example methods of arranging a scalable data center cooling system and cooling a data center according to the present disclosure.
Figure 3B:
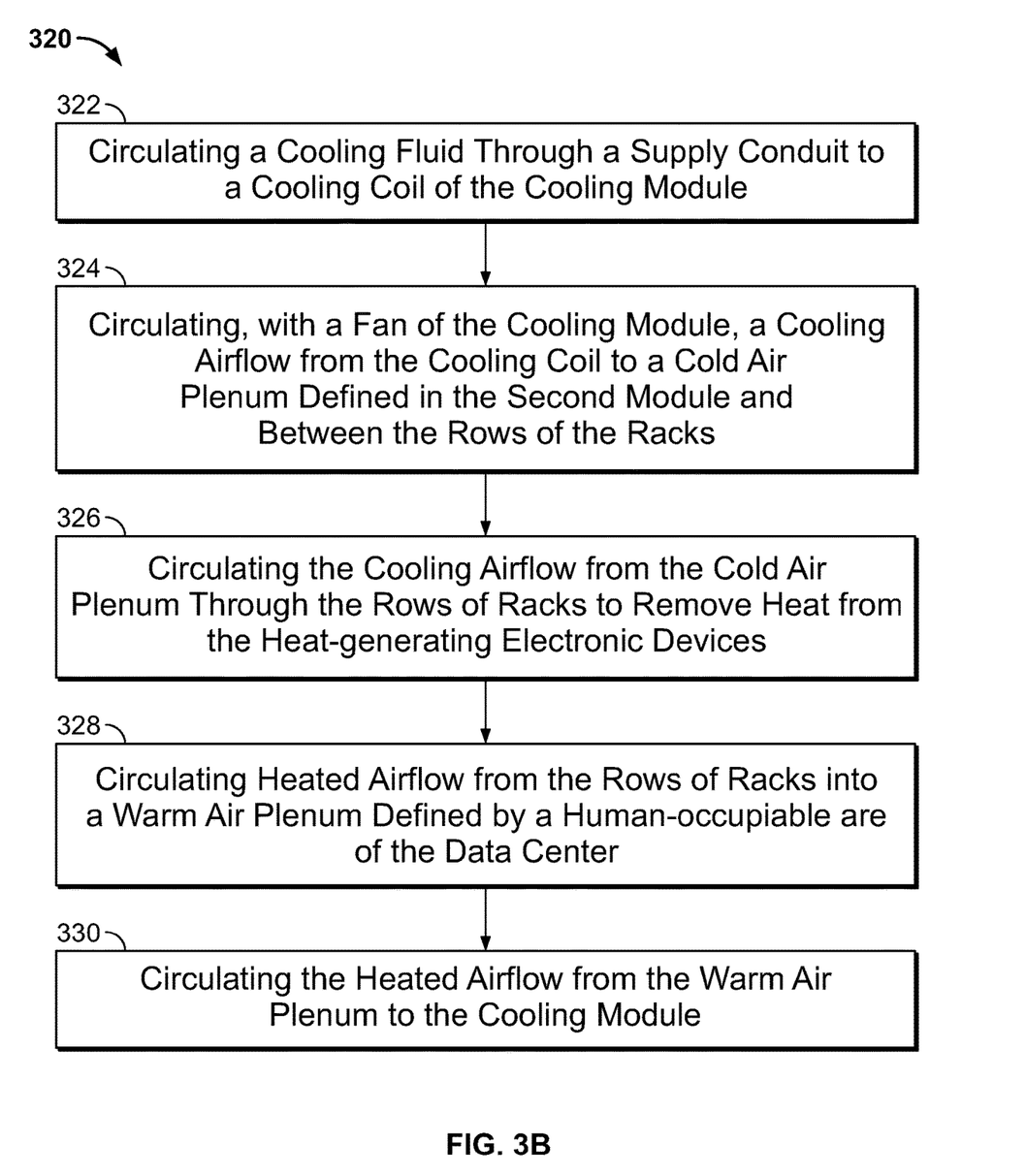
Figure 3C:
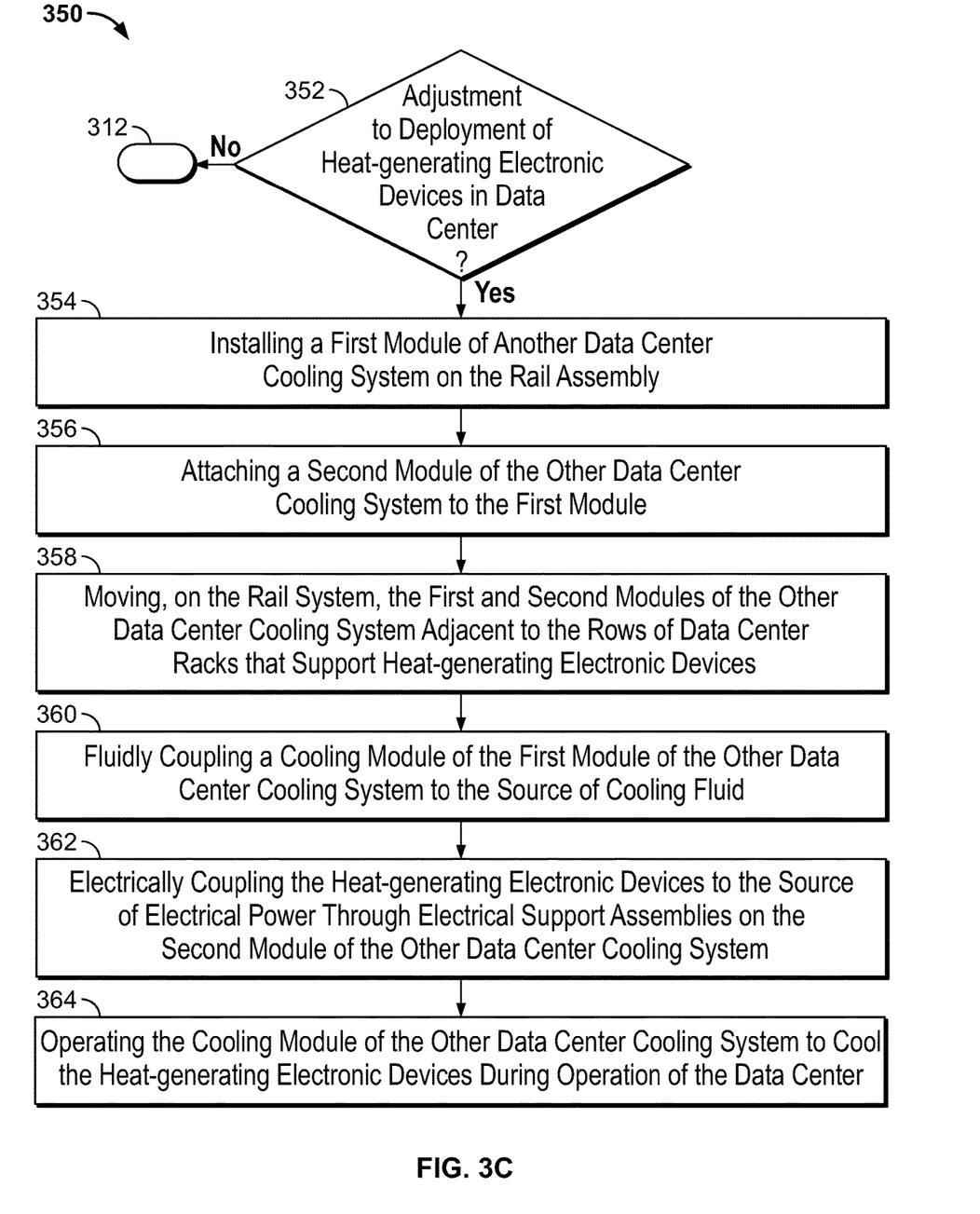

FIGS. 3A-3C are flowcharts depicting example methods 300, 320, and 350, respectively, of arranging a scalable data center cooling system and cooling a data center. FIG. 3A illustrates method 300, which may be performed with the data center cooling system 100, the data center system 200, or other data center cooling system according to the present disclosure. Method 300 may begin at step 302, which includes installing a first module of a data center cooling system on a rail assembly attached to a data center building. For example, in some aspects, an upper module, which includes a cooling system, may be mounted on a rail assembly (e.g., an I-beam, C-channel, or other structural member) that is attached to structure of the data center building. The structure may include, for example, columns that extend between a floor and a ceiling (or a roof) of the data center building. The structure may also include, for instance, beams (e.g., joists) that extend between columns of the data center building or hung from a ceiling or roof of the building. In some aspects, the upper module is mounted on the rail assembly with one or more roller assemblies (e.g., wheels, casters, rollers) that are attached to the upper module.

Method 300 may continue at step 304, which includes attaching a second module of the data center cooling system to the first module. For example, in some aspects, a lower module, which may include cable trays and other power and information support equipment, may be mounted to a bottom portion of the upper module. The lower module may include sides that extend from a top panel of the lower module. The sides may extend vertically downward to suspend above the floor of the data center at a height to receive rows of server (or other electronic) racks there between. In some aspects, step 304 may be performed prior to step 302, e.g., the lower module may be connected (e.g., fastened, welded) to the upper module prior to the upper module being mounted on the rail assembly.

Method 300 may continue at step 306, which includes moving, on a rail system, the first and second modules of the data center cooling system adjacent to the rows of data center racks that support heat-generating electronic devices (e.g., servers, networking devices, or other electronic devices). For example, the rail system may include the rail and roller assemblies, which cooperatively facilitate rolling (or other frictionless or near frictionless) movement of the data center cooling system that includes the upper and lower modules within a human-occupiable workspace of the data center building. Rows of the data center racks may be pre-deployed (e.g., installed prior to step 302) in the data center building, at locations that allow for movement of the data center cooling system adjacent the rows (e.g., as shown in FIGS. 1A-1C).

Method 300 may continue at step 308, which includes fluidly coupling a cooling module of the first module of the data center cooling system to a source of cooling fluid. In some aspects, each upper module may include one or more cooling coils that use a cooling fluid to cool heated air in an air-to-liquid heat exchanger. Supply and return conduits, which may be supported by an accessory module coupled to the upper module, may be fluidly connected to the coiling coils and to a source of the cooling fluid (e.g., chiller, cooling tower, heat exchanger, body of water, or other source of cooling fluid). In some aspects, supply and return conduit segments, mounted in a particular accessory module prior to steps 302-306, may be fluidly coupled (e.g., welded, with grooved piping, or other coupling technique) to other segments previously deployed in the data center building on other accessory modules in previously deployed data center cooling systems.

Method 300 may continue at step 310, which includes electrically coupling the heat-generating electronic devices to a source of electrical power through electrical support assemblies on the second module. For example, in some aspects, the electronic devices may be electrically coupled to power conduits (e.g., bus ducts or power buses or other power supply equipment) that are supported by the lower module. Such power conduits or bus ducts may be electrically coupled, or may have previously been electrically coupled, to a source of power at the data center building (e.g., utility power grid, generator, batteries, solar power or wind power systems, or other power source). Other components may also be electrically coupled to the source of electrical power in step 310. For example, fans that are part of the cooling modules in the upper modules may be electrically coupled to the source of power. Controllers, control equipment, motor controllers, variable frequency drives, and other cooling system automation equipment (e.g., sensors, actuators) may also be electrically coupled to the source of electrical power in step 310.

Method 300 may continue at step 312, which includes operating the cooling module to cool the heat-generating electronic devices during operation of the data center. For example, once the racks and data center cooling system are in position in the data center cooling system, the electronic devices may be operated to provide Information Technology (IT) services. During operation of the electronic devices, heat is generated which may be removed by a cooling airflow circulated by the cooling module.

FIG. 3B illustrates method 320, which may be performed with the data center cooling system 100, the data center system 200, or other data center cooling system according to the present disclosure. In some aspects, method 320 may include sub-steps to step 312 in method 300. Method 320 may begin at step 322, which includes circulating a cooling fluid through a supply conduit to a cooling coil of the cooling module. The cooling fluid may be, for example, chilled water, chilled glycol, a liquid refrigerant (e.g., in a direct expansion system), condenser water or other evaporatively cooled liquid, liquid from a natural or man-made body of water, or other cooling liquid. In some aspects, the cooling liquid is pumped from a source of the cooling liquid (e.g., a central plant) through supply conduits that are mounted in accessory modules of data center cooling systems as described with reference to FIGS. 1A-1C. The supply conduits may be segmented when installed as part of the accessory modules and joined (e.g., welded or connected) once the data center cooling systems are in place adjacent to rows of racks. Alternatively, the supply conduits may be installed in the accessory modules subsequent to the data center cooling systems being moved into place adjacent to rows of racks.

Method 320 may continue at step 324, which includes circulating, with a fan of the cooling module, a cooling airflow from the cooling coil to a cold air plenum defined in the second module and between the rows of the racks. For example, as shown in FIGS. 1A-1C, fans that are mounted to a bottom portion of the upper module (e.g., through apertures in a top panel of the lower modules) may circulate a cooling airflow downward from cooling coils through the lower modules (e.g., between side panels of the lower modules). In some aspects, the side panels (and other portions) of the lower modules may be insulated so that heat from a warm-air plenum external to the lower modules (e.g., within the human-occupiable workspace) does not transfer (or is impeded from transferring) into the cooling airflow within the lower module. The cold air plenum extends between rows of racks, into which the cooling airflow circulates by fan operation.

Method 320 may continue at step 326, which includes circulating the cooling airflow from the cold air plenum through the rows of racks to remove heat from the heat-generating electronic devices. The cooling airflow, driven by the fans of the cooling modules in the upper modules, circulates through rows of racks (as shown in FIGS. 1A-1C). As the cooling airflow circulates through the racks, heat from heat-generating electronic devices (e.g., servers, networking equipment, or other devices) is convectively transferred to the cooling airflow, warming the airflow. Thus, cooling airflow at a temperature below an operating temperature of the devices enters, in this example, a back open side of the rows of racks, and a heated airflow (at or slightly below the operating temperature) leaves a front open side of the rows of racks. In some aspects, additional fans may be mounted on or near the servers to further circulate the heated airflow from the racks.

Method 320 may continue at step 328, which includes circulating heated airflow from the rows of racks into a warm air plenum defined by a human-occupiable area of the data center. Once the heated airflow leaves the rows of racks, for example, the airflow circulates (e.g., by the fans) into the area adjacent the front open sides of the rows of racks. The warm air plenum extends through the human-occupiable area and upward to the ceiling of the data center building structure.

Method 320 may continue at step 330, which includes circulating the heated airflow from the warm air plenum to the cooling module. For example, as the heated airflow is circulated by the fans through the warm air plenum, the fans pull (in this example) the heated airflow toward and through the cooling coils of the cooling modules. Thus, heated airflow is cooled in the cooling coils by transferring heat from the airflow to the cooling liquid that is circulated through the cooling coils. The cooling liquid, heated by the heated airflow, is recirculated back to the source of the cooling liquid (e.g., through return conduits) to be re-cooled. Of course, steps 322-330 may be performed many times over and over as the data center operates.

FIG. 3C illustrates method 350, which may be performed with the data center cooling system 100, the data center system 200, or other data center cooling system according to the present disclosure. Method 350 may begin at step 352, which includes a determination of whether an adjustment to deployment of heat-generating electronic devices in data center has occurred. An adjustment to deployment may include one or more of the following actions. For example, in some aspects, an adjustment may include adding additional heat-generating devices (e.g., servers) to one or more racks that are already being cooled by previously deployed data center cooling systems as described with reference to FIGS. 1A-1C. As another example, an adjustment may include adding additional racks to one or more rows that are already being cooled by previously deployed data center cooling systems as described with reference to FIGS. 1A-1C. As another example, an adjustment may include adding additional rows of racks to a data center that includes one or more rows that are already being cooled by previously deployed data center cooling systems as described with reference to FIGS. 1A-1C. As another example, an adjustment may include replacing existing heat-generating devices (e.g., servers) with higher power density devices that generate more heat during operation to one or more racks that are already being cooled by previously deployed data center cooling systems as described with reference to FIGS. 1A-1C. As yet another example, an adjustment may include operating existing heat-generating devices (e.g., servers) at a greater utilization or power state, thereby generating more heat than previously, in one or more rows that are already being cooled by previously deployed data center cooling systems as described with reference to FIGS. 1A-1C. Generally, however, an adjustment to deployment may include any action which adjusts (increases or decreases) an amount of heat being generated by heat-generating electronic devices in a data center during operation of the data center. If the determination in step 352 is "no" then method 350 may continue at step 312, and operation of the data center cooling modules may continue.

If the determination in step 352 is "yes" then method 350 may continue at step 354, which includes installing a first module of another data center cooling system on the rail assembly. For example, in some aspects, another upper module, which includes another cooling system or module (e.g., cooling coil(s) and fan(s)), may be mounted on a rail assembly (e.g., the I-beam, C-channel, or other structural member) that is attached to structure of the data center building. The structure may include, for example, columns that extend between a floor and a ceiling (or a roof) of the data center building. The structure may also include, for instance, beams (e.g., joists) that extend between columns of the data center building or hung from a ceiling or roof of the building. In some aspects, the other upper module is mounted on the rail assembly with one or more roller assemblies (e.g., wheels, casters, rollers) that are attached to the upper module.

Method 350 may continue at step 356, which includes attaching a second module of the other data center cooling system to the first module. For example, in some aspects, another lower module, which may include cable trays and other power and information support equipment, may be mounted to a bottom portion of the additional upper module. The additional lower module may include sides that extend from a top panel vertically downward to suspend above the floor of the data center at a height to receive rows of server (or other electronic) racks there between. In some aspects, step 356 may be performed prior to step 354, e.g., the additional lower module may be connected (e.g., fastened, welded) to the additional upper module prior to the upper module being mounted on the rail assembly.

Method 350 may continue at step 358, which includes moving, on the rail system, the first and second modules of the other data center cooling system adjacent to the rows of data center racks that support heat-generating electronic devices. For example, the rail system may include the rail and roller assemblies, which cooperatively facilitate rolling (or other frictionless or near frictionless) movement of the additional data center cooling system that includes the additional upper and lower modules within the human-occupiable workspace of the data center building.

Method 350 may continue at step 360, which includes fluidly coupling a cooling module of the first module of the other data center cooling system to the source of cooling fluid. In some aspects, each upper module may include one or more cooling coils that use a cooling fluid to cool heated air in an air-to-liquid heat exchanger. Supply and return conduits, which may be supported by an accessory module coupled to the upper module, may be fluidly connected to the coiling coils and to a source of the cooling fluid (e.g., chiller, cooling tower, heat exchanger, body of water, or other source of cooling fluid). In some aspects, supply and return conduit segments, mounted in a particular accessory module prior to steps 302-306, may be fluidly coupled (e.g., welded, with grooved piping, or other coupling technique) to other segments previously deployed in the data center building on other accessory modules in previously deployed data center cooling systems.

Method 350 may continue at step 362, which includes electrically coupling the heat-generating electronic devices to the source of electrical power through electrical support assemblies on the second module of the other data center cooling system. For example, in some aspects, the electronic devices may be electrically coupled to power conduits (e.g., bus ducts or power buses or other power supply equipment) that are supported by the lower module. Such power conduits or bus ducts may be electrically coupled, or may have previously been electrically coupled, to a source of power at the data center building (e.g., utility power grid, generator, batteries, solar power or wind power systems, or other power source). Other components may also be electrically coupled to the source of electrical power in step 310. For example, fans that are part of the cooling modules in the upper modules may be electrically coupled to the source of power. Controllers, control equipment, motor controllers, variable frequency drives, and other cooling system automation equipment (e.g., sensors, actuators) may also be electrically coupled to the source of electrical power in step 310.

Method 350 may continue at step 364, which includes operating the cooling module of the other data center cooling system to cool the heat-generating electronic devices during operation of the data center. For example, once the racks and data center cooling system are in position in the data center cooling system, the electronic devices may be operated to provide Information Technology (IT) services. During operation of the electronic devices, heat is generated which may be removed by a cooling airflow circulated by the cooling module.

Method 350 may also include one or more steps (or not include one or more steps) shown in FIG. 3C. For example, in some aspects, an adjustment to deployment may not require an additional data center cooling system to be moved into the data center. Instead, an adjustment to deployment may require a change to an operating condition to an existing data center cooling system adjacently placed by rows of racks. For example, an adjustment to an airflow volume being circulated by the fans of the data center cooling systems, an adjustment to a cooling liquid flow rate circulated to cooling coils of the data center cooling systems, or an adjustment to one or more temperature or pressure set points (e.g., of the cooling airflow or cooling liquid flow) may address the adjustment to deployment. Also, in some cases, an adjustment to deployment may then lead to a reduction of a number of data center cooling systems in the data center (e.g., a removal of rows of racks). In which case, the data center cooling systems may be removed in a process that is substantially opposite of method 350 (e.g., electricity and cooling liquid are decoupled from the data center cooling systems, and the data center cooling systems are moved away or out of the data center on the rail assemblies).

Figure 4:
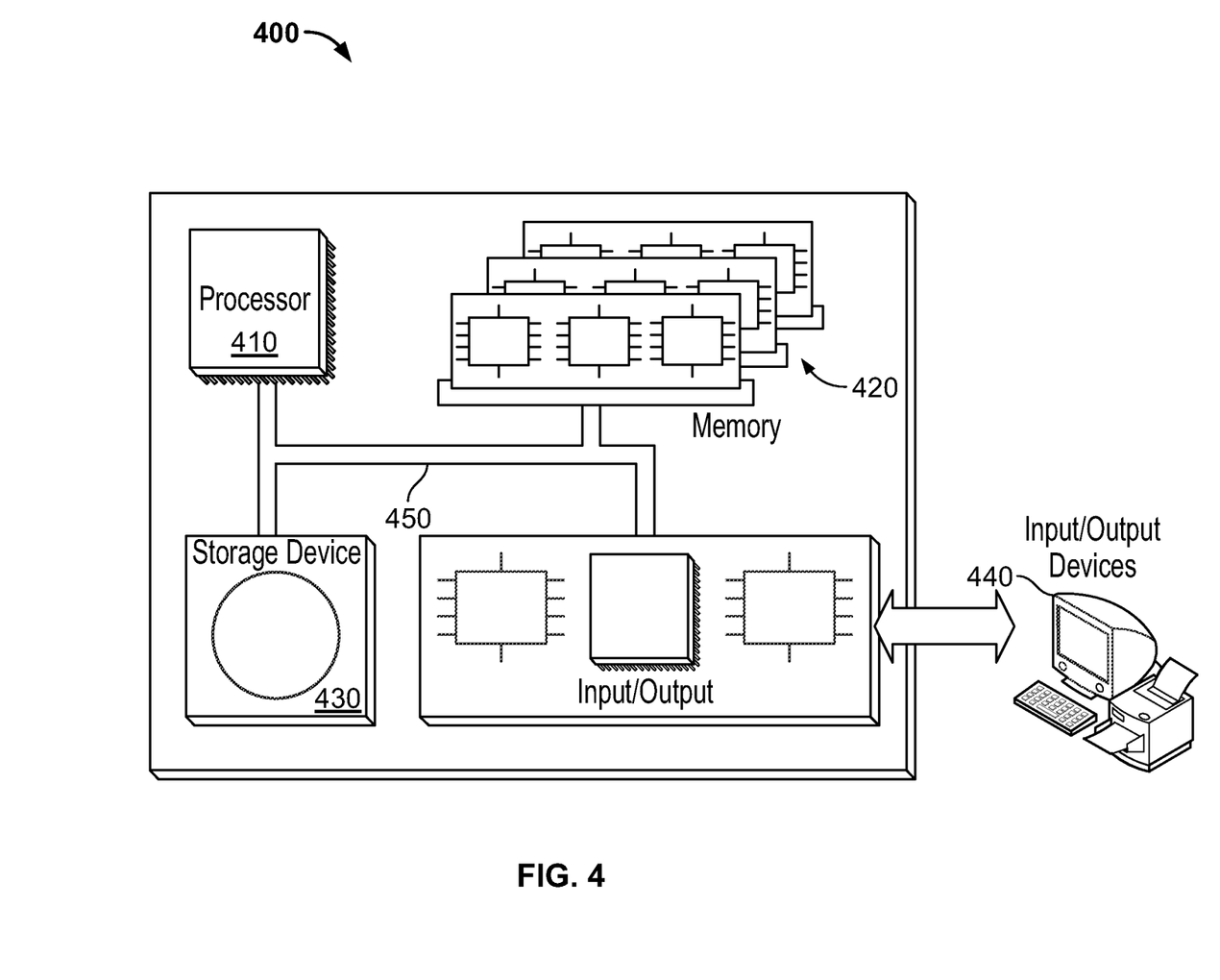
FIG. 4 is a schematic illustration of an example controller for a data center cooling system according to the present disclosure.

FIG. 4 is a schematic illustration of an example controller 400 (or control system) for an on-board fuel separation system. For example, the controller 400 can be used for the operations described previously, for example as or as part of a control system that performs one or more steps of methods 300, 320, and 350 described in FIGS. 3A-3C. For example, the controller 400 may be communicably coupled with, or as a part of, a data center cooling system that includes, e.g., pumps, fans, modulating valves, and other controllable components.

The controller 400 is intended to include various forms of digital computers, such as printed circuit boards (PCB), processors, digital circuitry, or otherwise that is part of a vehicle. Additionally the system can include portable storage media, such as, Universal Serial Bus (USB) flash drives. For example, the USB flash drives may store operating systems and other applications. The USB flash drives can include input/output components, such as a wireless transmitter or USB connector that may be inserted into a USB port of another computing device.

The controller 400 includes a processor 410, a memory 420, a storage device 430, and an input/output device 440. Each of the components 410, 420, 430, and 440 are interconnected using a system bus 450. The processor 410 is capable of processing instructions for execution within the controller 400. The processor may be designed using any of a number of architectures. For example, the processor 410 may be a CISC (Complex Instruction Set Computers) processor, a RISC (Reduced Instruction Set Computer) processor, or a MISC (Minimal Instruction Set Computer) processor.

In one implementation, the processor 410 is a single-threaded processor. In another implementation, the processor 410 is a multi-threaded processor. The processor 410 is capable of processing instructions stored in the memory 420 or on the storage device 430 to display graphical information for a user interface on the input/output device 440.

The memory 420 stores information within the controller 400. In one implementation, the memory 420 is a computer-readable medium. In one implementation, the memory 420 is a volatile memory unit. In another implementation, the memory 420 is a non-volatile memory unit.

The storage device 430 is capable of providing mass storage for the controller 400. In one implementation, the storage device 430 is a computer-readable medium. In various different implementations, the storage device 430 may be a floppy disk device, a hard disk device, an optical disk device, or a tape device.

The input/output device 440 provides input/output operations for the controller 400. In one implementation, the input/output device 440 includes a keyboard and/or pointing device. In another implementation, the input/output device 440 includes a display unit for displaying graphical user interfaces.

The features described can be implemented in digital electronic circuitry, or in computer hardware, firmware, software, or in combinations of them. The apparatus can be implemented in a computer program product tangibly embodied in an information carrier, for example, in a machine-readable storage device for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a trackball by which the user can provide input to the computer. Additionally, such activities can be implemented via touch-screen flat-panel displays and other appropriate mechanisms.

The features can be implemented in a control system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include a local area network ("LAN"), a wide area network ("WAN"), peer-to-peer networks (having ad-hoc or static members), grid computing infrastructures, and the Internet.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

A number of implementations have been described. Nevertheless, it will be understood that various modifications may be made without departing from the spirit and scope of the disclosure. For example, example operations, methods, or processes described herein may include more steps or fewer steps than those described. Further, the steps in such example operations, methods, or processes may be performed in different successions than that described or illustrated in the figures. Accordingly, other implementations are within the scope of the following claims.

What is claimed is:

1. A modular data center system, comprising:
   an upper module comprising a roller assembly attached to a frame of the upper module, the roller assembly configured to engage at least a portion of a rail assembly attached to a structure of a data center building; and
   a lower module attached to the upper module to suspend above a floor of a human-occupiable workspace of the data center building that supports a plurality of racks comprising a plurality of heat-generating electronic devices, the lower module comprising a power support assembly, at least a portion of the power support assembly electrically coupled between a source of electrical power and the plurality of heat-generating electronic devices.

2. The modular data center system of claim 1, wherein the upper module further comprises an air conditioning module.

3. The modular data center system of claim 2, wherein the lower module comprises at least one side that extends vertically from a ceiling that is attached to the frame of the upper module, the ceiling comprising an aperture to permit airflow from the air conditioning module to a volume defined by the side and the ceiling.

4. The modular data center system of claim 3, wherein the volume comprises a portion of a conditioned air plenum that extends from the ceiling of the lower module to a top of the plurality of racks, the conditioned air plenum further defined between back sides of rows of the plurality of racks.

5. The modular data center system of claim 4, wherein the air conditioning module comprises:
   at least one of an air cooling module or an air heating module that is positioned over the aperture in the ceiling of the lower module; and
   a fan positioned to circulate a conditioned airflow from the at least one of the air cooling module or the air heating module, through the portion of the conditioned air plenum, through the back sides of the rows of the plurality of racks, through front sides of the rows of the plurality of racks to the human-occupiable workspace, and to the at least one of the air cooling module or the air heating module.

6. The modular data center system of claim 5, wherein the conditioning module comprises at least one of a cooling coil, a heating coil, an energy recovery ventilator, or a constant or variable air volume box.

7. The modular data center system of claim 4, wherein the lower module further comprises a seal to receive a portion of the plurality of racks and seal against an airflow between the human-occupiable workspace and the portion of conditioned air plenum.

8. The modular data center system of claim 1, wherein the roller assembly comprises a plurality of wheels or sliders that engage the rail assembly.

9. The modular data center system of claim 1, wherein the structure of the data center building comprises a column that extends between the floor and a roof of the data center building.

10. The modular data center system of claim 1, further comprising an accessory module coupled to the upper module, the accessory module comprising a pipe rack.

11. A data center system, comprising:
    an upper module comprising an air conditioning module;
    a lower module attached to the upper module to suspend above a floor of a human-occupiable workspace of a data center building that supports a plurality of racks comprising a plurality of heat-generating electronic devices, the lower module comprising a power support assembly, at least a portion of the power support assembly electrically coupled between a source of electrical power and the plurality of heat-generating electronic devices;
    a roller or slider assembly attached to a frame of the upper module, the roller assembly comprising at least one roller or slider; and
    a rail assembly attachable to a structure of the data center building, the rail assembly comprising a beam engageable by the roller or slider.

12. The data center system of claim 11, wherein the lower module comprises at least one side that extends vertically from a ceiling that is attached to the frame of the upper module, the ceiling comprising an aperture to permit airflow between the upper module and a volume defined by the side and the ceiling of the lower module.

13. The data center system of claim 12, wherein the volume comprises a portion of a conditioned air plenum that extends from the ceiling of the lower module to a top of the plurality of racks, the conditioned air plenum further defined between back sides of rows of the plurality of racks.

14. The data center system of claim 13, wherein the air conditioning module is positioned over the aperture in the ceiling of the lower module and comprises at least one of an air cooling module or an air heating module and a fan, the fan positioned over the aperture to circulate a conditioned airflow from the at least one of the air cooling module or the air heating module, through the portion of the conditioned air plenum, through the back sides of the rows of the plurality of racks, through front sides of the rows of the plurality of racks to the human-occupiable workspace, and back to the at least one of the air cooling module or the air heating module.

15. The data center system of claim 14, wherein the at least one of the air cooling module or the air heating module comprises at least one of a cooling coil, a heating coil, an energy recovery ventilator, or a constant or variable air volume box.

16. The data center system of claim 14, wherein the lower module further comprises a seal to receive a portion of the plurality of racks and seal against an airflow between the human-occupiable workspace and the portion of the conditioned air plenum.

17. The data center system of claim 12, wherein the structure of the data center building comprises a column that extends between the floor and a roof of the data center building.

18. The data center system of claim 16, wherein the beam extends between at least two columns of the data center building.

19. The data center system of claim 11, further comprising an accessory module coupled to the upper module, the accessory module comprising a pipe rack.

20. The data center system of claim 19, wherein the accessory module further comprises a plurality of fire protection electrical assemblies that comprise wiring and electrical connectors for a fire protection system.

21. The data center system of claim 20, wherein the accessory module further comprises at least a portion of a fire protection system piping system that comprises a plurality of sprinkler heads of the fire protection system.

22. The data center system of claim 19, wherein the accessory module further comprises a plurality of data center lighting fixtures or data center lighting wiring assemblies.

23. The data center system of claim 12, further comprising a support structure that comprises at least a portion of the ceiling to thermally separate cold air aisle of the conditioned plenum from a warm air aisle.

* * * * *